US011227775B2

United States Patent
Pyeon et al.

(10) Patent No.: US 11,227,775 B2
(45) Date of Patent: Jan. 18, 2022

(54) METHOD OF FABRICATING CARRIER FOR WAFER LEVEL PACKAGE BY USING LEAD FRAME

(71) Applicant: HAESUNG DS CO., LTD., Changwon-si (KR)

(72) Inventors: Dong Young Pyeon, Guri-si (KR); Sung Il Kang, Gimhae-si (KR); Jong Hoe Ku, Gimhae-si (KR); In Seob Bae, Changwon-si (KR)

(73) Assignee: HAESUNGDS CO., LTD., Changwon-si (KR)

( * ) Notice: Subject to any disclaimer, the term of this patent is extended or adjusted under 35 U.S.C. 154(b) by 0 days.

(21) Appl. No.: 16/854,704

(22) Filed: Apr. 21, 2020

(65) Prior Publication Data

US 2021/0098268 A1 Apr. 1, 2021

(30) Foreign Application Priority Data

Oct. 1, 2019 (KR) ........................ 10-2019-0121739

(51) Int. Cl.
*H01L 21/00* (2006.01)
*H01L 21/48* (2006.01)
*H01L 23/00* (2006.01)

(52) U.S. Cl.
CPC ...... *H01L 21/4828* (2013.01); *H01L 21/4835* (2013.01); *H01L 24/94* (2013.01)

(58) Field of Classification Search
None
See application file for complete search history.

(56) References Cited

U.S. PATENT DOCUMENTS

2014/0332942 A1* 11/2014 Kanemoto ............ H01L 24/06
 257/676
2019/0057930 A1 2/2019 Bae et al.
(Continued)

FOREIGN PATENT DOCUMENTS

JP 2000294715 A 10/2000
JP 2002280488 A 9/2002
(Continued)

OTHER PUBLICATIONS

Korean Intellectual Property Office, Office Action in Korean Patent Application No. 10-2019-0121739 dated Dec. 6, 2019, 5 pages, English translation not available.
(Continued)

*Primary Examiner* — Reema Patel
(74) *Attorney, Agent, or Firm* — Schwabe Williamson & Wyatt

(57) ABSTRACT

According to an embodiment of the disclosure, a method of fabricating a carrier for a wafer level package (WLP) by using a lead frame, wherein the lead frame is fabricated by forming a trench and a post by performing first half etching on an upper surface of a base substrate comprising a conductive material, filling the first-half-etched surface with resin of an insulating material, removing the resin exposed to outside of the trench so that an upper surface of the trench and an upper surface of the resin are at a same level, and performing second half etching on a lower surface of the base substrate, in which a memory chip is attached to the lower surface of the base substrate.

20 Claims, 3 Drawing Sheets

(56) References Cited

U.S. PATENT DOCUMENTS

| | | |
|---|---|---|
| 2019/0067082 A1 | 2/2019 | Kang et al. |
| 2019/0122968 A1 | 4/2019 | Bae et al. |
| 2019/0267315 A1 | 8/2019 | Bae et al. |

FOREIGN PATENT DOCUMENTS

| | | |
|---|---|---|
| JP | 2008112961 A | 5/2008 |
| JP | 2010238694 A | 10/2010 |
| JP | 2014207481 A | 10/2014 |
| JP | 2017168691 A | 9/2017 |
| JP | 2018166182 A | 10/2018 |
| JP | 20190145774 A | 8/2019 |
| KR | 101747226 B1 | 6/2017 |
| KR | 20190024243 A | 3/2019 |
| TW | 201803035 A | 1/2018 |

OTHER PUBLICATIONS

Korean Intellectual Property Office, Rejection Decision in Korean Patent Application No. 10-2019-0121739 dated Dec. 6, 2019, 4 pages, English translation not available.
Korean Intellectual Property Office, Office Action in Korean Patent Application No. 10-2018-0222231, dated Apr. 17, 2019, 5 pages.
United States Patent and Trademark Office, Non-Final Office Action in U.S. Appl. No. 16/145,026 dated Apr. 15, 2020, 23 pages.
United States Patent and Trademark Office, Final Office Action in U.S. Appl. No. 16/145,026 dated Sep. 17, 2020, 12 pages.

\* cited by examiner

METHOD OF FABRICATING CARRIER FOR WAFER LEVEL PACKAGE BY USING LEAD FRAME

CROSS-REFERENCE TO RELATED APPLICATION

This application claims the benefit of Korean Patent Application No. 10-2019-0121739, filed on Oct. 1, 2019, in the Korean Intellectual Property Office, the disclosure of which is incorporated herein in its entirety by reference.

BACKGROUND

1. Field

The disclosure relates to a method of fabricating a semiconductor package substrate and a semiconductor package substrate fabricated by using the method. More particularly, the disclosure relates to a method and structure for fabricating a carrier to protect a chip by using a lead frame in a memory semiconductor fabricated in a wafer level package.

2. Description of Related Art

In the fabrication of an existing semiconductor package substrate, a through hole is formed by using a copper clad laminate (CCL) where a copper foil is stacked, an upper surface copper foil and a lower surface copper foil are electrically connected to each other by plating the inner surface of the through hole, and then the upper surface copper foil and the lower surface copper foil are each patterned by using photoresist.

In a memory semiconductor, when a carrier structure for protecting a chip is fabricated by using a PCB substrate as described above, as a CCL having a thickness of about 15 μm is used, no sawing burr problem occurs. A sawing burr refers to waste of a conductive layer formed on the surface of a flexible circuit substrate in a process of forming a through hole. However, an existing semiconductor package substrate fabricated of a PCB substrate has a problem of not being suitable for a structure requiring heat dissipation characteristics, due to the heat transfer feature of a material.

SUMMARY

According to an embodiment of the disclosure, provided is a method of fabricating a carrier structure having excellent heat dissipation characteristics and high strength by using a lead frame in a memory semiconductor fabricated as a wafer level package.

According to another embodiment of the disclosure, provided is a method of fabricating a lead frame to reduce sawing burr generated when a carrier structure is fabricated.

Additional aspects will be set forth in part in the description which follows and, in part, will be apparent from the description, or may be learned by practice of the presented embodiments of the disclosure.

According to an embodiment of the disclosure, a method of fabricating a carrier for a wafer level package by using a lead frame, wherein the lead frame is fabricated by forming a trench and a post by performing first half etching on an upper surface of a base substrate comprising a conductive material, filling the first-half-etched surface with resin of an insulating material, removing the resin exposed to the outside of the trench so that an upper surface of the trench and an upper surface of the resin form a same level, and performing second half etching on a lower surface of the base substrate, in which a memory chip is attached to the lower surface of the base substrate.

In an embodiment of the disclosure, the first half etching may be performed to reduce sawing burr.

In an embodiment of the disclosure, the second half etching may be performed to reduce sawing burr.

In an embodiment of the disclosure, sawing burr may be reduced by making an etching rate of an upper surface of the base substrate at a position corresponding to a portion where the memory chip is attached, different from an etching rate of the upper surface of the base substrate at a position corresponding to a portion where the memory chip is not attached.

In an embodiment of the disclosure, sawing burr may be further reduced through the second half etching by etching a portion where the memory is not attached.

In an embodiment of the disclosure, sawing burr between semiconductor packages may be reduced through the first half etching by making an etching rate of an inner part of different from an etching rate of the sawing street.

In an embodiment of the disclosure, sawing burr may be further reduced by etching, through the second half etching, a portion of the lower surface of the base substrate substantially corresponding to the sawing street formed through the first half etching.

In an embodiment of the disclosure, by using a dry film resist (DFR) barrier, DFR patterns of a sawing street part may be all opened, and a DFR pattern of a certain part other than the sawing street part in the upper surface of the base substrate may be partially opened so as to enable different etching rates.

According to another embodiment of the disclosure, a method of fabricating a carrier for a wafer level package by using a lead frame, wherein the lead frame is fabricated by forming a trench and a post by performing first half etching on an upper surface of a base substrate comprising a conductive material, filling the first-half-etched surface with resin of an insulating material, removing the resin exposed to the outside of the trench so that an upper surface of the trench and an upper surface of the resin form a same level, and performing second half etching on a lower surface of the base substrate, wherein the first half etching is performed using a dry film resist (DFR) barrier so as to reduce sawing burr.

In an embodiment of the disclosure, a memory chip may be attached to the lower surface of the base substrate.

In an embodiment of the disclosure, DFR patterns of a sawing street part may be all opened, and a DFR pattern of a certain part other than the sawing street part in the upper surface of the base substrate may be partially opened so as to enable different etching rates.

In an embodiment of the disclosure, the second half etching may be performed to reduce sawing burr by reducing a thickness of a sawing street.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
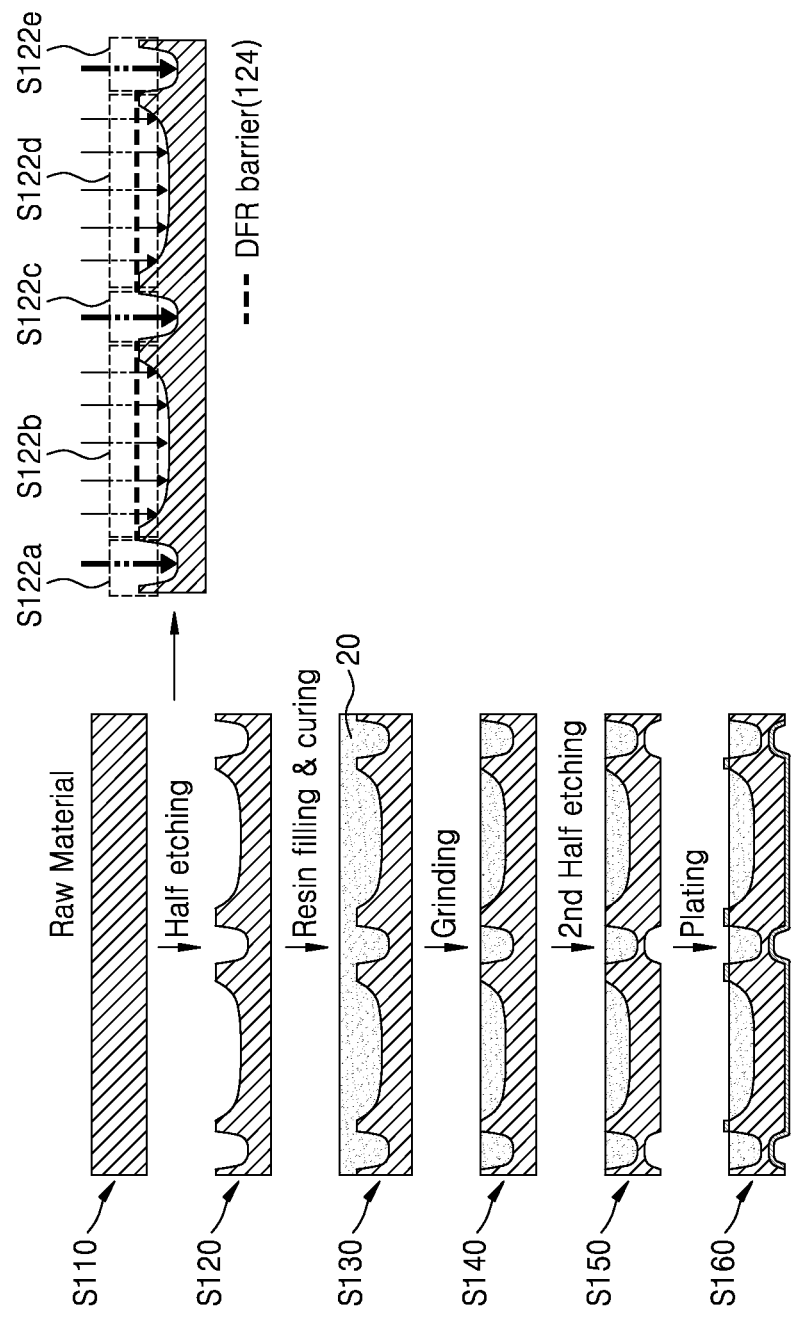
FIGS. 1 to 3 schematically illustrate the operations of a method of fabricating a carrier for a wafer level package by using a lead frame, according to an embodiment of the disclosure.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

In the following embodiments, it will be understood that when a component, such as a layer, a film, a region, or a plate, is referred to as being "on" another component, the component can be directly on the other component or intervening components may be present thereon. Furthermore, sizes of components in the drawings may be exaggerated for convenience of explanation. For example, since sizes and thicknesses of components in the drawings are arbitrarily illustrated for convenience of explanation, the following embodiments are not limited thereto.

Figure 2:
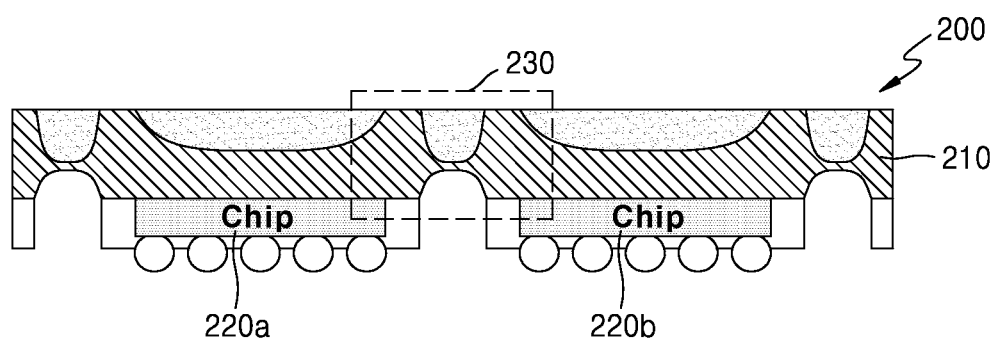
Figure 3:
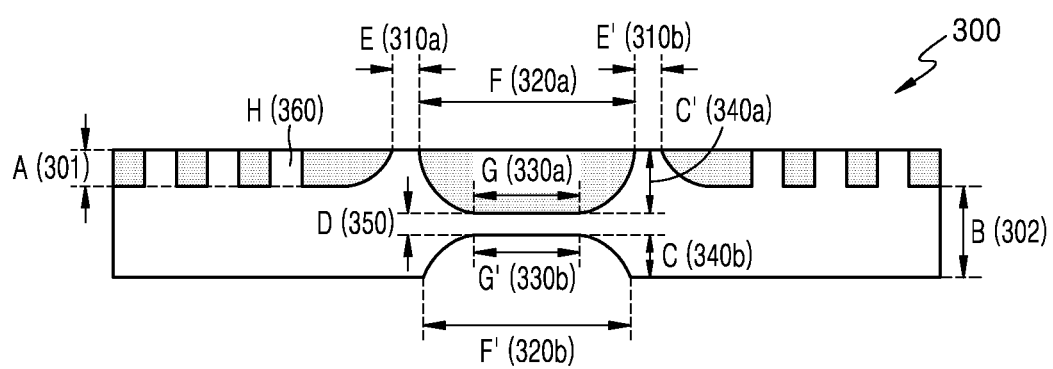

FIGS. 1 to 3 are schematic cross-sectional views of operations of methods of fabricating a semiconductor package substrate, according to embodiments of the disclosure.

According to a method of fabricating a semiconductor package substrate according to the present embodiment, first, as illustrated in FIG. 1, a base substrate of a conductive material is prepared (S110). The base substrate S110 may have a flat panel shape and include an electrically conductive material. An electrically conductive material may include, for example, Cu or a Cu alloy such as Cu—Sn, Cu—Zr, Cu—Fe, or Cu—Zn, or Fe or a Fe alloy such as Fe—Ni or Fe—Ni—Co.

After the base substrate S110 of a conductive material is prepared, a trench or post is formed on an upper surface through first half etching (S120). The trench means an incomplete penetration of the base substrate S110. A post is a column connecting an upper surface and a lower surface of the base substrate S110, which may electrically connect later an upper circuit wiring disposed on an upper surface of the base substrate S110 and a lower circuit wiring disposed on a lower surface thereof. The post may be disposed between a plurality of trenches, and also the post may have a shape extending in one direction or a bent shape on a plan view. The post may be a copper (Cu) post 360 as shown in an embodiment of FIG. 3.

As in the embodiment of the disclosure, when the base substrate S110 is used as a lead frame for simultaneously fabricating a plurality of semiconductor packages of a single unit, sawing street parts S122a, S122c, and S122e are provided as guide lines for guiding cutting of each semiconductor package of a single unit for singulation.

In an embodiment of the disclosure, in a process of performing first half etching on the upper surface (S120), to reduce sawing burr between the respective packages, an etching rate of trench inner parts S122b and S122d and an etching rate of sawing street are made different from each other. To this end, a dry film resist (DFR) barrier of a photosensitive material may be used.

Referring to FIG. 1, DFR patterns of the sawing street parts S122a, S122c, and S122e are all opened in the upper surface of the base substrate S110, and DFR patterns of trench inner parts S122b and S122d other than the sawing street parts S122a, S122c, and S122e are partially opened in the upper surface of the base substrate S110, and thus etching rates may be adjusted to differ from each other by making a flow rate of an etching solution different. However, the etching method using a DFR barrier is a mere embodiment of the disclosure, and the disclosure is not limited thereto and various modifications such as a method of coating positive or negative photoresist.

After the base substrate S110 is first-half-etched (S120), a first-half-etched surface is filled with resin of an insulating material (S130). The resin is an insulating material that is not electrically conductive, and may include polyimide, photo solder resist (PSR), or epoxy molding composite (EMC). In some embodiments, resin may include thermosetting resin that is polymerized and cured by a thermal treatment. In some embodiments, resin may include photosensitive resin. The filling of resin 20 may be performed by using a liquid resin material, or by using a solid tape including a resin component. After filling resin, as necessary, a process of thermosetting the resin 20 in an oven may be performed. Before filling the trench of the base substrate S110 with resin (S130), to make a surface of the trench inner part to be rough, a rough plating layer may be formed, or a plasma treatment, an ultraviolet treatment, or an etching process using a persulfate solution in the trench inner part may be added. Through the above process, an adhesive force between the base substrate and the resin may be improved.

Then, the resin exposed to the outside of the trench so that an upper surface of the trench and an upper surface of the resin form the same level (S140). In other words, when the resin is over coated on the upper surface of the base substrate S110, the upper surface of the trench and the upper surface of the resin may form the same level by removing the over coated resin by mechanical processing such as brushing, grinding, or polishing or chemical resin etching.

Then, second half etching is performed on the lower surface of the base substrate S110, thereby performing patterning on the lower portion of the base substrate S110 (S150). In an embodiment of the disclosure, the second half etching may be performed to additionally reduce the sawing burr. Then, the upper surface and lower surface of the base substrate S110 are plate-processed (S160). In this case, a bonding force between a memory chip and the lead frame may be increased by performing roughness-plate between the memory chip and the lead frame.

FIG. 2 illustrates an example of attaching the memory chip on the lead frame, according to an embodiment of the disclosure. Referring to the embodiment of FIG. 2, a method of performing first half etching and a method of performing second half etching to reduce sawing burr are described.

In an embodiment of the disclosure, sawing burr may be reduced by making a first half etching rate in an upper surface of the base substrate 210 at a position corresponding to a portion of a lower surface of the base substrate 210 where memory chips 220a and 220b are attached, different from a first half etching rate in the upper surface of the base substrate 210 at a position 230 corresponding to a portion of the lower surface of the base substrate 210 where the memory chips 220a and 220b are not attached.

Furthermore, in this case, the sawing burr may be additionally reduced by performing second half etching at the position 230 of the lower surface of the base substrate 210 where the memory chips 220a and 220b are not attached.

A detailed description is presented with reference to FIG. 3.

FIG. 3 illustrates a lead frame according to an embodiment of the disclosure, wherein A 301 denotes resin (resin body), B 302 denotes a base substrate (Cu body), C and C' 340a and 340b denote a trench depth, D 350 denotes a sawing street thickness, E and E' 310a and 310b denote a post (Cu post), G and G' 330a and 330b denote sawing streets, and H 350 denotes a Cu post.

In an embodiment of the disclosure, as a carrier for a wafer level package is fabricated by using the lead frame as in the embodiment of FIG. 3, heat generated from the memory chip may be discharged at a higher efficiency than that in the PCB. In an embodiment of the disclosure, as the base substrate is fabricated by using a conductive material such as Cu, heat may be discharged at a higher efficiency than that in the PCB.

To this end, in an embodiment of the disclosure, in the process of performing first half etching on the upper surface of the base substrate (S120 of FIG. 1), as the height of B 302 is fabricated to be higher than the height of A 301, the volume of B is increased so that thermal conductivity may be increased.

In an embodiment of the disclosure, in the first half etching process, as the height of C' 340a is fabricated to be greater than the height of A 301, abrasion of a cutting blade during cutting is reduced and sawing burr generated when Cu is cut is reduced so that the quality of appearance may be improved.

In an embodiment of the disclosure, in order to reduce cutting burr by reducing the volume of the sawing street formed by G and G' 330a and 330b, in the first half etching processing, etching depths of A 301 and C' 340a may be made different by using the DFR barrier.

In another embodiment of the disclosure, to increase the thermal conductivity of a body B 320 part, a Cu post may be further added to A 301 part.

In another embodiment of the disclosure, in the process of performing second half etching on a lower surface of the base substrate, to further reduce the sawing burr, a C 340b part is second-half-etched so that a D 350 value may be reduced or the second half etching may be performed so that the resin only remains.

As such, while the present disclosure has been particularly shown and described with reference to preferred embodiments using specific terminologies, the embodiments and terminologies should be considered in descriptive sense only and not for purposes of limitation. Therefore, it will be understood by those of ordinary skill in the art that various changes in form and details may be made therein without departing from the spirit and scope of the present disclosure as defined by the following claims According to the embodiment of the disclosure, a method of fabricating a semiconductor package substrate and a semiconductor package fabricated by using the method has merits in that heat dissipation characteristics are excellent and strength is high. Furthermore, a carrier package substrate to protect a chip that is weak to the external physical impact may be provided.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope of the disclosure as defined by the following claims.

What is claimed is:

1. A method of fabricating a carrier for a wafer level package (WLP) by using a lead frame, wherein the lead frame is fabricated by:
    forming a trench and a post by performing first half etching on an upper surface of a base substrate comprising a conductive material;
    filling the first-half-etched surface with resin of an insulating material;
    removing the resin exposed to an outside of the trench so that an upper surface of the trench and an upper surface of the resin are at a same level; and
    performing second half etching on a lower surface of the base substrate, wherein a memory chip is attached to the lower surface of the base substrate;
    wherein, through the first half etching, sawing burr between semiconductor packages is reduced by making an etching rate of an inner part of the trench different from an etching rate of a sawing street.

2. The method of claim 1, wherein the first half etching is performed to reduce the sawing burr.

3. The method of claim 1, wherein the second half etching is performed to reduce the sawing burr.

4. The method of claim 2, wherein the sawing burr is reduced by making an etching rate of an upper surface of the base substrate at a position corresponding to a portion where the memory chip is attached, different from an etching rate of the upper surface of the base substrate at a position corresponding to a portion where the memory chip is not attached.

5. The method of claim 4, wherein, through the second half etching, the sawing burr is further reduced by etching the portion where the memory is not attached.

6. The method of claim 1, wherein the sawing burr is further reduced by etching, through the second half etching, a portion of the lower surface of the base substrate proximate to the sawing street formed through the first half etching.

7. The method of claim 1, wherein, by using a dry film resist (DFR) barrier, DFR patterns of the sawing street part are all opened, and a DFR pattern of a certain part other than the sawing street part in the upper surface of the base substrate is partially opened so as to enable different etching rates.

8. A method of fabricating a carrier for a wafer level package (WLP) by using a lead frame, wherein the lead frame is fabricated by:
    forming a trench and a post by performing first half etching on an upper surface of a base substrate comprising a conductive material;
    filling the first-half-etched surface with resin of an insulating material;
    removing the resin exposed to an outside of the trench so that an upper surface of the trench and an upper surface of the resin are at a same level; and
    performing second half etching on a lower surface of the base substrate, wherein the first half etching is performed using a dry film resist (DFR) barrier so as to reduce sawing burr;
    wherein, through the first half etching, sawing burr between semiconductor packages is reduced by making an etching rate of an inner part of the trench different from an etching rate of a sawing street.

9. The method of claim 8, wherein a memory chip is attached to the lower surface of the base substrate.

10. The method of claim 9, wherein DFR patterns of the sawing street part are all opened, and a DFR pattern of a certain part other than the sawing street part in the upper surface of the base substrate is partially opened so as to enable different etching rates.

11. The method of claim 8, wherein the second half etching is performed to reduce the sawing burr by reducing a thickness of the sawing street.

12. The method of claim 8, wherein the post comprises a copper (Cu) post.

13. A method of fabricating a carrier for a wafer level package (WLP) by using a lead frame, wherein the lead frame is fabricated by:
   forming a trench and a post by performing first half etching on an upper surface of a base substrate comprising a conductive material;
   filling the first-half-etched surface with resin of an insulating material;
   removing the resin exposed to an outside of the trench so that an upper surface of the trench and an upper surface of the resin are at a same level; and
   performing second half etching on a lower surface of the base substrate without exposing the resin, wherein a memory chip is attached to the lower surface of the base substrate.

14. The method of claim 13, wherein the first half etching is performed to reduce sawing burr.

15. The method of claim 13, wherein the second half etching is performed to reduce sawing burr.

16. The method of claim 14, wherein the sawing burr is reduced by making an etching rate of an upper surface of the base substrate at a position corresponding to a portion where the memory chip is attached, different from an etching rate of the upper surface of the base substrate at a position corresponding to a portion where the memory chip is not attached.

17. The method of claim 16, wherein, through the second half etching, the sawing burr is further reduced by etching the portion where the memory is not attached.

18. The method of claim 13, wherein, through the first half etching, sawing burr between semiconductor packages is reduced by making an etching rate of an inner part of the trench different from an etching rate of the sawing street.

19. The method of claim 18, wherein the sawing burr is further reduced by etching, through the second half etching, a portion of the lower surface of the base substrate proximate to the sawing street formed through the first half etching.

20. The method of claim 13, wherein, by using a dry film resist (DFR) barrier, DFR patterns of the sawing street part are all opened, and a DFR pattern of a certain part other than the sawing street part in the upper surface of the base substrate is partially opened so as to enable different etching rates.

* * * * *